(12) United States Patent
Stark et al.

(10) Patent No.: US 7,842,907 B2
(45) Date of Patent: Nov. 30, 2010

(54) MICROWAVE GENERATOR

(75) Inventors: Robert Stark, Bad Windsheim (DE); Jürgen Urban, Erlangen (DE)

(73) Assignee: Diehl BGT Defence GmbH Co., KG, Überlingen (DE)

( * ) Notice: Subject to any disclaimer, the term of this patent is extended or adjusted under 35 U.S.C. 154(b) by 691 days.

(21) Appl. No.: 11/770,832

(22) Filed: Jun. 29, 2007

(65) Prior Publication Data
US 2008/0122363 A1    May 29, 2008

(30) Foreign Application Priority Data
Jul. 1, 2006    (DE)   ........................ 10 2006 030 514

(51) Int. Cl.
    *H05B 6/72*      (2006.01)
    *H01J 23/16*      (2006.01)
    *H01J 19/80*      (2006.01)
    *H01J 25/50*      (2006.01)

(52) U.S. Cl. ............................. 219/761; 315/3; 315/39; 315/39.51

(58) Field of Classification Search .............. 315/39.51, 315/39, 3, 111.21, 39.77; 219/761
See application file for complete search history.

(56) References Cited
U.S. PATENT DOCUMENTS 6,679,179 B1 *   1/2004   Bohl et al. .................. 102/501
7,002,300 B2     2/2006   Urban et al.
2004/0190214 A1 *   9/2004   Dommer et al. ............. 361/128
2004/0201942 A1 *   10/2004   Staines et al. ................ 361/130

FOREIGN PATENT DOCUMENTS

DE           10151565 A1    10/2001
DE        102005002279 A1    1/2005
WO     WO2007082687      12/2009

OTHER PUBLICATIONS

K. Hong, et al., "Development of Antenna-Source System for Generation of High-Power Electromagnetic Pulses", Document No. XP-001113855; IEEE 2002, pp. 203-206.

* cited by examiner

*Primary Examiner*—Tu B Hoang
*Assistant Examiner*—Hung Nguyen
(74) *Attorney, Agent, or Firm*—Scully, Scott, Murphy & Presser, P.C.

(57) ABSTRACT

A microwave generator (10) having a hollow central electrode (12) with a front face including hollow emmission element (18), and having an outer electrode (14), which coaxially surrounds the central electrode (12) along an axially extending resonator section (16). The two electrodes (12, 14) define a spark gap (36) and are connected to a high-voltage source (38). An ultracompact microwave generator (10) is implemented by the high-voltage source (38) being arranged in the hollow central electrode (12) of the microwave generator (10) rather than on the outside thereof.

6 Claims, 1 Drawing Sheet

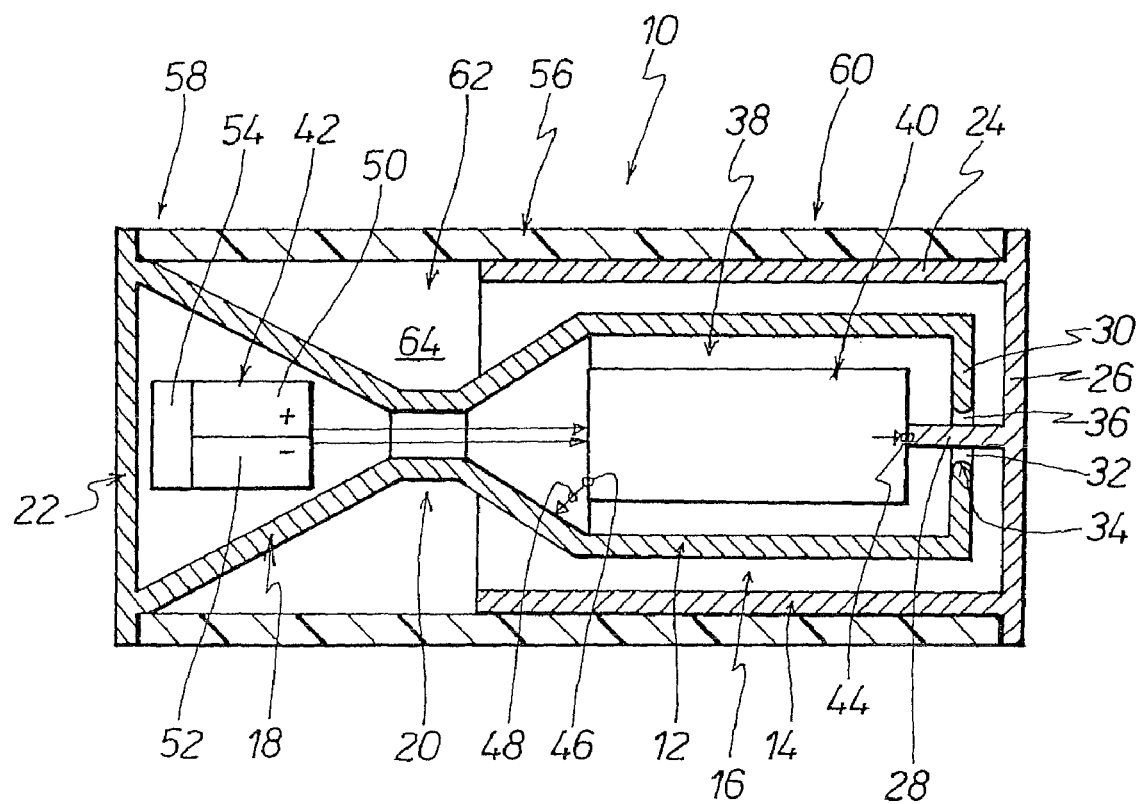

MICROWAVE GENERATOR

BACKGROUND OF THE INVENTION

1. Field of the Invention

The present invention relates to a microwave generator, which includes a hollow central electrode having a front face with a hollow emission element and an outer electrode, which coaxially surrounds the central electrode along an axially extending resonator section.

The operation of a microwave generator such as the foregoing is based on a high-voltage source being short-circuited and thus discharged via a spark gap in the microwave generator. The high-voltage source may have a capacitor bank, which is charged in parallel on the basis of the principle of the Marx impulse-voltage circuit, and is then connected in series. As an alternative to the use of a Marx impulse-voltage circuit, that is to say of a Marx generator, it is also possible to use a high-voltage generator driven by explosives, which can produce a single high-voltage pulse with an extremely high pulse energy.

The short-circuiting of the high-voltage source via the spark gap creates highly oscillating discharge or short-circuit currents with a steep flank, which contain a mixture of very high frequencies which are emitted as, microwave energy via an emission element (in the form of an antenna) of the microwave; generator, with a broadband spectrum that is dependent on the respective frequency mixture. The broadband microwave spectrum has a very high energy density, so that, for example, radio traffic in the vicinity of a microwave generator such as this is at least adversely affected, and input circuits of electronic circuits can be interfered with, or in the extreme even destroyed, as a result of resonance effects.

2. Discussion of the Prior Art

DE 101 51 565 A1 discloses a microwave generator which has a high-voltage spark gap between electrodes which are arranged such that they are aligned axially.

On both sides of the spark, gap, the electrodes and their coaxial holders are accompanied over at least a portion of their axial longitudinal extent by an electrical conductor which runs at a distance from them and is electrically conductively connected to one of the two electrodes. In this known microwave generator, the spark gap is formed between a small electrode in the form of a mushroom head, and a relatively large electrode, in the form of a lobe. The electrode in the form of a lobe is surrounded by an outer conductor, which is connected via an appropriate connection structure to the electrode which is in the form of a mushroom head. The axial position of the connection structure may be moved together with the electrode which is in the form of a mushroom head by means of a spindle mechanism relative to the stationary, second electrode, for tuning purposes.

The prior DE patent application 10 2005 002 279 discloses a microwave generator having a central electrode which has arm emission element on the front face, and having an outer electrode which coaxially surrounds the central electrode along an axially extending resonator section, with the two electrodes being designed to be rotationally symmetrical and defining a spark gap which flashes over when a high voltage is applied, emitting microwaves via the emission element of the central electrode. This microwave generator essentially comprises the two metallic electrodes, specifically the central electrode with the emission element, and the outer electrode which coaxially surrounds it. The two electrodes are arranged in sealed form in an electrically insulating housing sleeve and can be charged from a pulsed high-voltage source simply by making contact with the two ends of the microwave generator, which are axially remote from one another. This represents a so-called two-wire feed for the microwave generator. The internal area of the microwave generator, which is defined by the two electrodes and the electrically insulating housing sleeve and is bounded in a sealed form, may be filled with a gaseous or with a liquid dielectric in order to increase the dielectric strength. By way of example, the gaseous dielectric may be $SF_6$.

The last-mentioned form of the microwave generator is preferably formed by the high-voltage source being a Marx generator which is arranged at the side alongside the microwave generator and parallel to it, so that the voltage outputs which are provided at the mutually remote ends of the Marx generator can be connected to the axially mutually remote ends of the microwave generator. Although this ensures the optimum dielectric strength, the space required, that is to say the area required, is, however, correspondingly large because the high-voltage source is arranged at the side alongside the microwave generator.

SUMMARY OF THE INVENTION

The invention is based on the object of providing a microwave generator of the type mentioned initially, in which the space required, that is to say the area required, is comparatively small, that is to say it is very compact.

According to the invention, this object is achieved in that the high-voltage source is arranged in the hollow central electrode. Preferred refinements and developments of the microwave generator according to the invention are characterized in the dependent claims.

Since, in the case of the microwave generator according to the invention, the high-voltage source is located in the interior of the microwave generator rather than outside it, the space required, that is to say the area required, is correspondingly small, that is to say an ultracompact microwave generator can be produced according to the invention.

By way of example the ultracompact microwave generator according to the invention can be accommodated in a vehicle and can be initiated by radio at a desired time. This makes it possible, for example, to deliberately stop the vehicle. Another application option for the microwave generator according to the invention is for indoor use, for example against computers, monitoring systems, alarm systems or the like. When used in this way, the microwave generator can be introduced into a building, for example by special forces, and can be activated by radio lichen access is subsequently desired.

BRIEF DESCRIPTION OF THE DRAWING

Further details, features and advantages will become evident from the following description of one exemplary embodiment of the microwave generator according to the invention, which is illustrated schematically in the single drawing FIGURE, which is in the form of a longitudinal section.

DETAILED DESCRIPTION OF THE INVENTION

The FIGURE shows an embodiment of the microwave generator 10 according to the invention which has a hollow central electrode 12 and an outer electrode 14. The hollow central electrode 12 and the outer electrode 14 which surround it coaxially define an axially extending resonator section 16 of the microwave generator 10.

A hollow emission element 18 is connected at the front end and integrally with the material to the hollow central electrode 12. The emission element 18 widens forwards from a constriction 20, and is closed at the front end by in end wall 22, forming a seal.

The outer electrode 14 is in the fond of a pot with a cylindrical wall 24 and a rear-face base 26. A connecting element 28 extends forwards centrally and integrally with the material from the base 26. On the rear face, the hollow central electrode 12 has a base wall 30 with a central aperture hole 32. The connecting element 28 facing away from the base 26 of the outer electrode 14 extends centrally through the central aperture hole 32 in the base wall 30 of the central electrode 12. An annular spark gap 36 is therefore formed between the connecting element 28 in the annular edge 34 of the central aperture hole 32 in the base 30 of the central electrode 12.

A high-voltage source 38 is connected to the two rotationally symmetrically electrodes 12 and 14 of the microwave generator 10, and has a Marx generator 40 and an electrical power supply device 42 for the Marx generator 40. The Marx generator 40 has a high-voltage pulse output 44 and high voltage earth output 46. The high-voltage pulse output 44 of the Marx generator 40 makes contact with the connecting element 28 of the outer electrode 14 of the microwave generator 10. The high-voltage earth output 46 of the Marx generator 40 is connected to the central electrode 12, as is indicated by the arrow 48.

The Marx generator 40 is arranged in the interior of the hollow central electrode 12, and the electrical power supply device 42 for the Marx generator 40 is arranged in the hollow emission element 18 of the microwave generator 10.

The electrical power supply device 42 has two DC/DC high-voltage converters 50 and 52, which are fed from a battery 54.

A housing sleeve 56 which is composed of an electrically insulating material is firmly connected by its front end 58 to the hollow emission element 18, forming a seal. The housing sleeve 56 is firmly connected by its rear-face end section 60 to the outer electrode 14, forming a seal, thus resulting in a sealed internal area 62 which is defined at the front end by the end wall 22 of the emission element 18, at the rear end by the base 26 of the outer electrode 14, and circumferentially by the housing sleeve 56. The internal area 62 is filled with a gaseous or a liquid dielectric 64 in order to increase the dielectric strength of the microwave generator 10.

The integration of the high-voltage source 38, that is to say of the Marx generator 40 and of the associated electrical power supply device 42 in the internal area 62 of the microwave generator 10 advantageously results in an ultracompact microwave generator 10, in comparison to a two-wire end feed and in comparison to an axially aligned, that is to say coaxial, feed.

LIST OF REFERENCE SYMBOLS

10 Microwave generator
12 Hollow central electrode (of 10)
14 Outer electrode (of 10)
16 Resonator section (of 10 between 12 and 14)
18 Hollow emmission element (on 12)
20 Constriction (between 12 and 18)
22 End wall (of 18)
24 Cylindrical wall (of 14)
26 Rear-face base (of 14)
28 Connecting element (on 26 for 44)
30 Rear-face base wall (of 12)
32 Central aperture hole (in 30)
34 Annular edge (of 32)
36 Annular spark gap (between 34 and 28)
38 High-voltage source (for 10)
40 Marx generator (of 38)
42 Electrical power supply device (for 40)
44 High-voltage pulse output (of 40)
46 High-voltage earth output (of 40)
48 Arrow/connection (between 46 and 12)
50 DC/DC high-voltage converter (of 42)
52 DC/DC high-voltage converter (of 42)
54 Battery (for 42)
56 Housing sleeve (of 00)
58 Front end (of 56)
60 Rear-face end section (of 56)
62 Internal area (of 10 between 56, 22 and 26)
64 Dielectric (in 62)

What is claimed is:

1. A microwave generator having a hollow central electrode (12) possessing a front face which has a hollow emission element (18), an outer electrode (14) which coaxially surrounds the central electrode (12) along an axially extending resonator section (16), said two electrodes (12, 14) defining a spark gap (36) and which electrodes are connected to a high-voltage source (38), the high-voltage source (38) being arranged in the hollow central electrode (12); said high-voltage source (38) including a Marx generator (40) and an electrical power supply device (42) for the Marx generator (40), said Marx generator (40) being arranged in the resonator section (16) of the hollow central electrode (12); and the electrical power supply device (42) being arranged in the hollow emission element (18).

2. A microwave generator according to claim 1, wherein the electrical power supply device (42) includes two battery-powered DC/DC high-voltage converters (50, 52) which are connected to the Marx generator (40).

3. A microwave generator according to claim 1, wherein the outer electrode (14) is in the form of a pot having a cylindrical wall (24) and a base (26), a connecting element (28) extending forwardly, centrally and integrally with material from the base (26) and making contact with a high-voltage pulse output (44) of the Marx generator (40), the central electrode (12) being connected to a high-voltage earth output (46) having a base wall (30) on a rear face with a central aperture hole (32) which extends through the connecting element (28) of the outer electrode (14), such that said spark gap (36) is formed annularly between the connecting element (28) and an annular edge (34) of the aperture hole (32).

4. A microwave generator according to claim 1, wherein the outer electrode (14) firmly closes a housing sleeve (56) composed of an electrically insulating material on a rear face, and the emission element (18) of the central electrode (12) firmly closes a housing sleeve (56) on the front face, thereby forming a seal.

5. A microwave generator according to claim 4, wherein an internal area (62) which is defined by the housing sleeve (56) of the microwave generator (10) is filled with selectively a gaseous or a liquid dielectric (64).

6. A microwave generator according to claim 1, wherein the emission element (18) is closed on the front face by an end wall (22).

* * * * *